United States Patent
Chou et al.

(10) Patent No.: US 6,946,344 B2
(45) Date of Patent: Sep. 20, 2005

(54) METHOD FOR FORMING TRENCH CAPACITOR

(75) Inventors: Shih-Chung Chou, Kaohsiung (TW); Yi-Nan Chen, Taipei (TW); Tzu-Ching Tsai, Taoyuan (TW)

(73) Assignee: Nanya Technology Corporation, Taoyuan (TW)

(*) Notice: Subject to any disclaimer, the term of this patent is extended or adjusted under 35 U.S.C. 154(b) by 74 days.

(21) Appl. No.: 10/620,743

(22) Filed: Jul. 16, 2003

(65) Prior Publication Data

US 2004/0250392 A1 Dec. 16, 2004

(30) Foreign Application Priority Data

May 9, 2003 (TW) .................................. 92112650 A

(51) Int. Cl.[7] .................... H01L 21/8242; H01L 21/20
(52) U.S. Cl. ................... 438/249; 438/248; 438/247; 438/246; 438/244; 438/387; 438/392; 438/391; 438/390
(58) Field of Search ............................ 438/243–249, 438/386–392; 257/301–305

(56) References Cited

U.S. PATENT DOCUMENTS

| | | | | |
|---|---|---|---|---|
| 4,743,563 A | * | 5/1988 | Pfiester et al. .............. 438/440 |
| 4,984,039 A | * | 1/1991 | Douglas ..................... 257/301 |
| 5,372,951 A | * | 12/1994 | Anjum et al. ............... 438/440 |
| 5,576,226 A | * | 11/1996 | Hwang ....................... 438/275 |
| 6,358,865 B2 | * | 3/2002 | Pearce et al. .............. 438/763 |
| 6,362,040 B1 | * | 3/2002 | Tews et al. ................. 438/246 |
| 6,410,991 B1 | * | 6/2002 | Kawai et al. ............... 257/392 |
| 6,426,253 B1 | * | 7/2002 | Tews et al. ................. 438/243 |
| 6,426,526 B1 | * | 7/2002 | Divakaruni et al. ........ 257/302 |
| 6,458,647 B1 | * | 10/2002 | Tews et al. ................. 438/246 |
| 6,498,061 B2 | * | 12/2002 | Divakaruni et al. ........ 438/243 |
| 6,573,137 B1 | * | 6/2003 | Divakaruni et al. ........ 438/248 |
| 6,576,944 B2 | * | 6/2003 | Weis .......................... 257/301 |
| 6,630,379 B2 | * | 10/2003 | Mandelman et al. ....... 438/243 |
| 2001/0042880 A1 | * | 11/2001 | Divakaruni et al. ........ 257/301 |
| 2002/0149047 A1 | * | 10/2002 | Divakaruni et al. ........ 257/302 |

* cited by examiner

*Primary Examiner*—Ha Tran Nguyen
*Assistant Examiner*—Jennifer M. Kennedy
(74) *Attorney, Agent, or Firm*—Quintero Law Office

(57) ABSTRACT

A method for forming a trench capacitor. A semiconductor substrate with a trench is provided, and a trench capacitor is formed in the trench with a storage node and a node dielectric layer. The top portion of the trench is ion implanted to a predetermined angle to form an ion doped area on a sidewall of the top portion of the trench and a top surface of the trench capacitor. The ion doped area is oxidized to form an oxide layer. A sidewall semiconductor layer is formed on another sidewall using the oxide layer as a mask, and then the oxide layer is removed. A barrier layer is conformally formed on the surface of the trench, and the trench is filled with a conducting layer.

21 Claims, 14 Drawing Sheets

METHOD FOR FORMING TRENCH CAPACITOR

BACKGROUND OF THE INVENTION

1. Field of the Invention

The invention relates to a trench capacitor, and more particularly to a method for forming a trench capacitor with a collar dielectric layer to reduce the top width of the trench capacitor.

2. Description of the Related Art

A conventional DRAM cell consists of a MOS and a capacitor, and the capacitor is normally a deep trench capacitor to reduce the size of the memory cell.

FIG. 1A is a top view of a deep trench array of a conventional DRAM. In a folded bit line structure, each active area includes two word lines WL1 and WL2 and a bit line BL. In FIG. 1A, DT is a deep trench and BC is a bit line contact.

FIG. 1B is a cross-section of a deep trench array of a conventional DRAM. A deep trench DT is formed in a semiconductor substrate 10, and a deep trench capacitor 12 having a node dielectric and a storage node is formed in a bottom of the deep trench DT. A method for forming the deep trench capacitor 12 is described as follows. The p+ semiconductor substrate 10 is anisotropically etched to form a deep trench DT. A heavily doped oxide layer, such as ASG, is formed on the sidewall and the bottom of the deep trench DT, and annealed to diffuse ions into the semiconductor substrate 10 of the bottom of the deep trench to form an n+ type diffusion region 14 as a buried plate. A silicon nitride layer 16 is formed on the sidewall and bottom of the deep trench DT as a capacitor dielectric layer. The deep trench DT is filled with a first poly layer 18 doped with n+ type ions, and the poly layer 108 is recessed to a predetermined depth as a storage node of the deep trench capacitor 12.

A collar dielectric layer 20 is formed on a sidewall of a top portion of the deep trench DT, and a second poly layer 22 and a third poly layer 24 are sequentially formed in the deep trench. Word lines WL1 and WL2, S/D 28, a bit line contact BC, and a bit line BL are sequentially formed. DRAMs are separated by STI structures 26.

A buried strap outdiffusion region 30 acting as a node junction is formed in the semiconductor substrate 10 near an opening of the deep trench DT to connect the deep trench capacitor 12 and the MOS on the surface of the semiconductor substrate 10. A method for forming the buried strap outdiffusion region 30 is described as follows. N+ type ions in the second poly layer 22 are diffused into the semiconductor substrate 10 through the third poly layer 24, acting here as a buried strap. The collar dielectric layer 20 isolates the buried strap outdiffusion region 30 and the buried plate 14 effectively to avoid retention time decrease by leakage current from the DRAM.

FIG. 2A to 2E are cross-sections of a conventional method for forming a collar dielectric layer.

In FIG. 2A, the deep trench capacitor 12 in the p+ type semiconductor substrate 10 comprises a pad silicon nitride layer 32, the deep trench DT, the n+ type diffusion region 14, the silicon nitride layer 16, and the first poly layer 18 doped by n+ type ions.

In FIG. 2B, the silicon nitride layer 16 on the top portion of the deep trench DT is removed, and the first poly layer 18 is recessed. The exposed semiconductor substrate 10 is oxidized to form a first oxide layer 34 covering a sidewall of the top portion of the deep trench. The first oxide layer 34 isolates the n+ type diffusion region 14 and the buried strap outdiffusion region 30.

In FIG. 2C, a second oxide layer 36 is deposited by CVD, and anisotropic etching is performed to remove portions thereof from the first poly layer 18.

In FIG. 2D, the second poly layer 22 doped by n+ type ions is deposited in the deep trench DT, and the second poly layer 22 is recessed to a predetermined depth.

In FIG. 2E, a portion of the first oxide layer 34 and second oxide layer 36 are removed by wet etching until the top portion of the second poly layer 22 protrudes. The collar dielectric layer 20 consists of the remaining first oxide layer 34 and the remaining second oxide layer 36.

When forming the first oxide layer 34, a portion of the semiconductor substrate 10 is transformed into SiO2, and removed by wet etching. Thus, the size of the top portion of the deep trench 34 is increased.

Overlap tolerance between the word line WL and the deep trench DT is decreased, and the overlap region L between S/D diffusion region 28 and the buried strap outdiffusion region 30 is reduced. Serious current leakage occurs in the buried strap outdiffusion region 30, affecting a sub-Vt. The process of forming the first oxide layer 34 increases the top width of the deep trench DT. If the process is omitted, leakage current between the n+ type diffusion region 14 and the buried strap outdiffusion region 30 is substantially increased.

SUMMARY OF THE INVENTION

The present invention is directed to a method for forming a trench capacitor with an additional semiconductor layer on a single sidewall of a top portion of a deep trench to reduce width of the top portion.

Accordingly, the present invention provides a method for forming a trench capacitor. A semiconductor substrate is provided, a deep trench and a deep trench capacitor are formed therein, the deep trench capacitor having a node dielectric layer and a storage node, the node dielectric layer formed covering a sidewall and a bottom portion between the deep trench and the storage node of the deep trench capacitor, and the storage node filling the deep trench to a predetermined depth. The deep trench top portion is ion implanted at a predetermined angle to form an ion doped area on a single sidewall of the semiconductor substrate and the top surface of the deep trench capacitor. An oxide layer is formed on the ion doped area. A sidewall layer is formed on the sidewall of the deep trench using the oxide layer as a mask, wherein he sidewall layer is isolated from the storage node of the deep trench capacitor. The oxide layer is removed. A barrier layer is formed on the interior of the deep trench and the sidewall layer. The deep trench is filled with a conducting layer.

Accordingly, the present invention provides another method for forming a trench capacitor. A semiconductor substrate is provided, with a deep trench and a deep trench capacitor formed therein, the deep trench capacitor having a node dielectric layer and a storage node, the node dielectric layer covering a sidewall and a bottom portion between the deep trench and the storage node of the deep trench capacitor, the storage node filling the deep trench to a predetermined depth, wherein the deep trench has a first sidewall and a second sidewall. The deep trench top portion is ion implanted at a predetermined angle to form an ion doped area on the semiconductor substrate of the first sidewall and the top surface of the deep trench capacitor. The semiconductor substrate is oxidized to form a first oxide layer on the ion doped area and a second oxide layer on the second sidewall, wherein the thickness of the first oxide layer exceeds the thickness of the second oxide layer. The second oxide layer is removed to expose the semiconductor substrate of the second sidewall of the deep trench. A sidewall layer is formed on the second sidewall using the first oxide layer as a mask. The first oxide layer is removed to expose the semiconductor substrate of the first sidewall. A first barrier layer is conformally formed on the first sidewall, the sidewall layer, and the deep capacitor. Spacers are formed on the first sidewall and a sidewall of the sidewall layer sequentially. The deep trench is filled with a first conducting layer. The first conducting layer and the spacer are recessed to a predetermined depth sequentially. A second barrier layer is conformally formed on the first sidewall, the sidewall layer, and the first conducting layer. The deep trench is filled with a second conducting layer.

BRIEF DESCRIPTION OF THE DRAWINGS

For a better understanding of the present invention, reference is made to a detailed description to be read in conjunction with the accompanying drawings, in which.

DETAILED DESCRIPTION OF THE INVENTION

FIGS. 3a to 3h are cross-sections showing the method for forming a trench capacitor of the present invention.

Figure 1A:
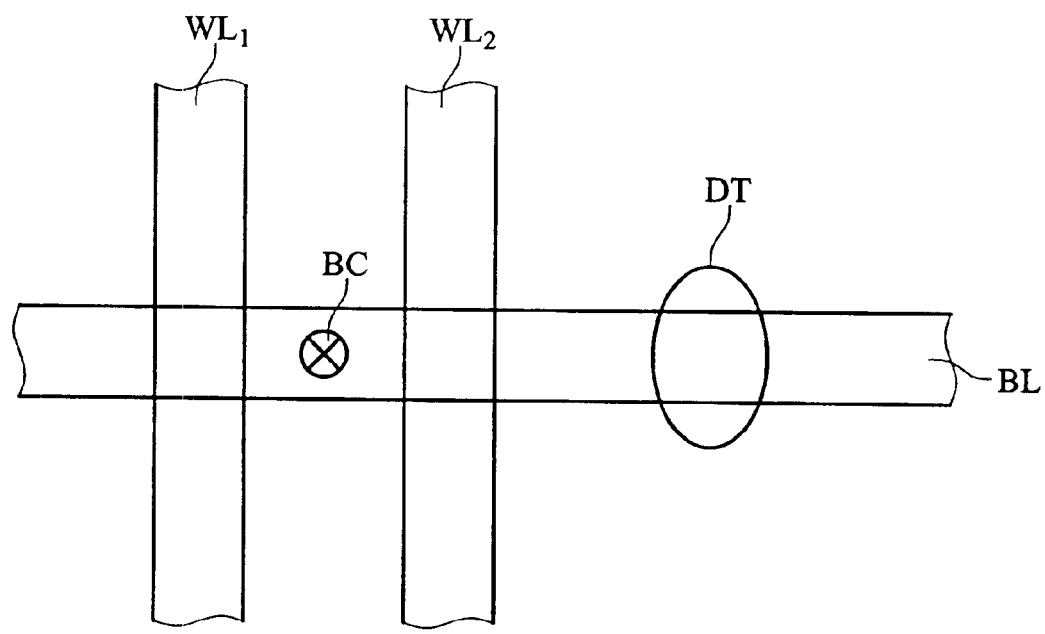
FIG. 1A is a top view of a deep trench array of a conventional DRAM.
Figure 1B:
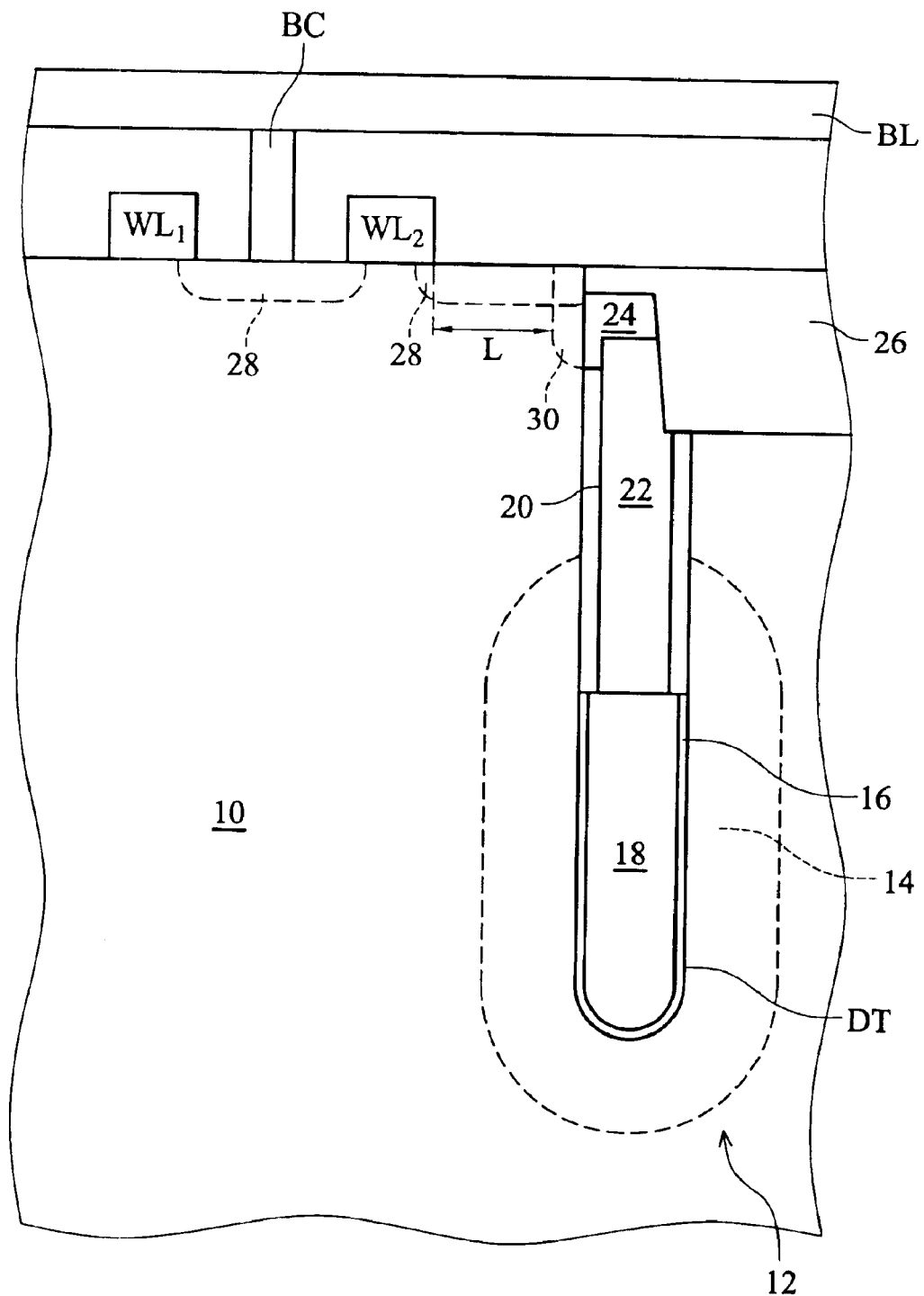
FIG. 1B is a cross-section of a deep trench array of a conventional DRAM.
Figure 2A:
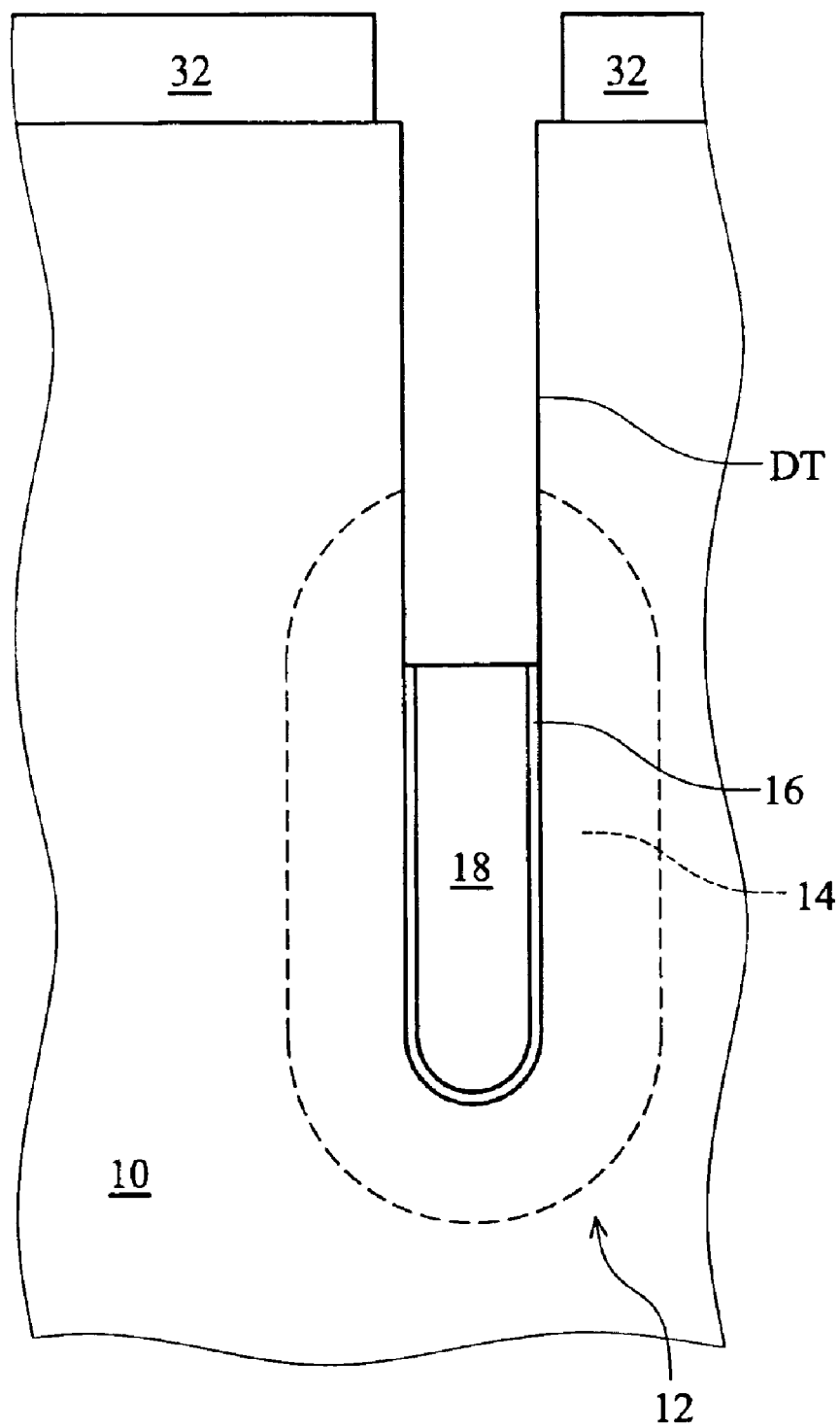
FIGS. 2A to 2E are cross-sections showing a conventional method for fabricating a collar dielectric layer.
Figure 2B:
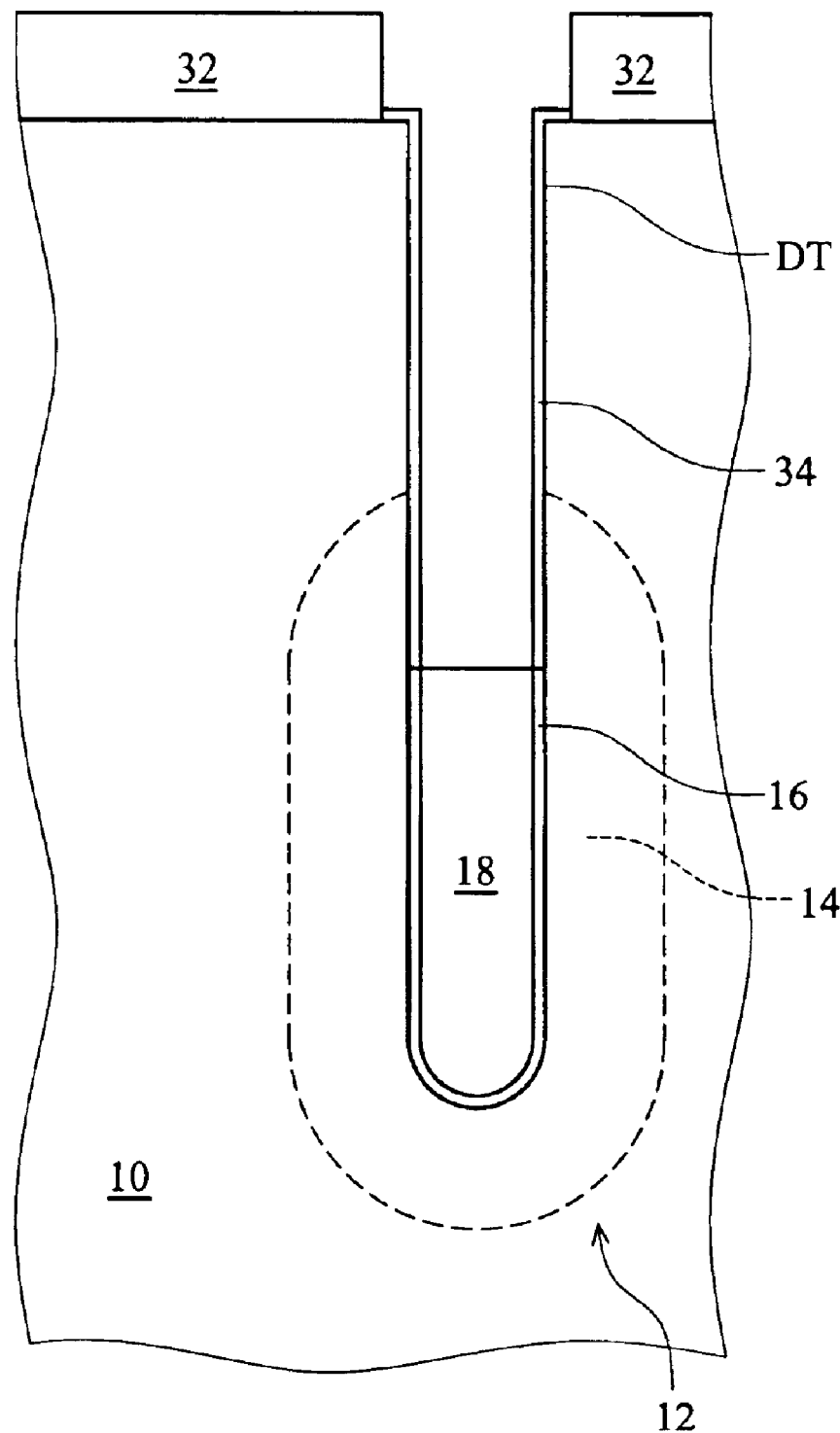
Figure 2C:
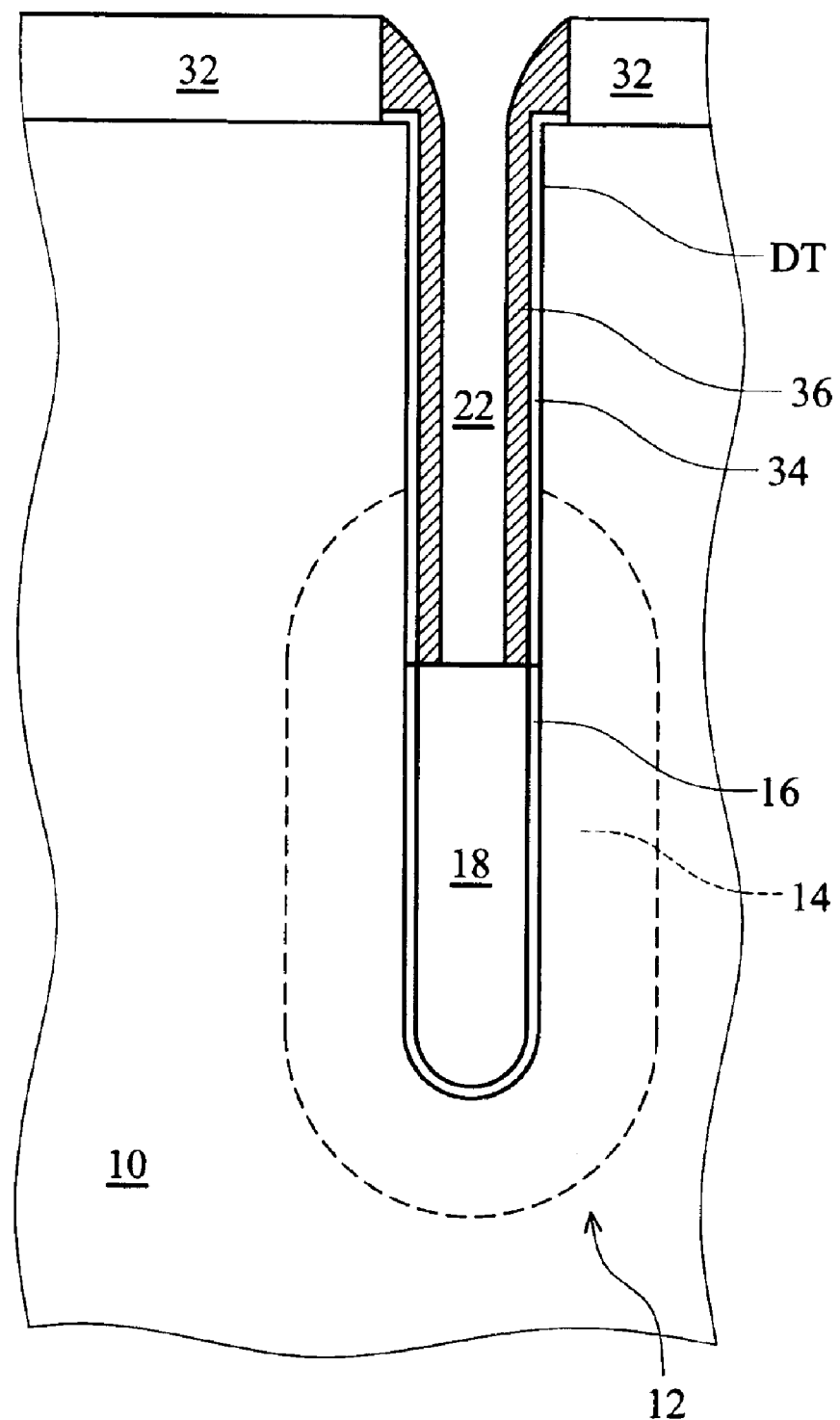
Figure 2D:
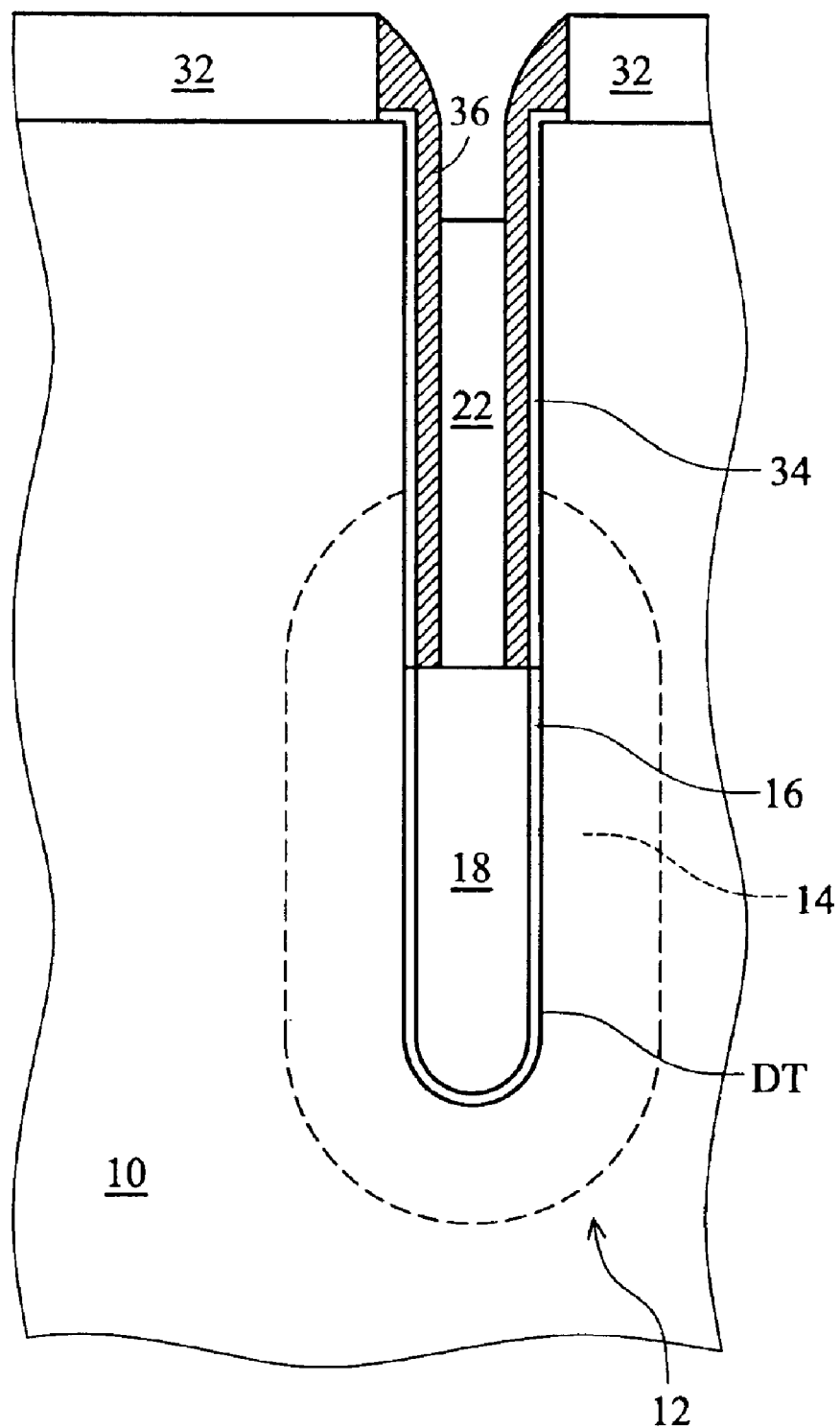
Figure 2E:
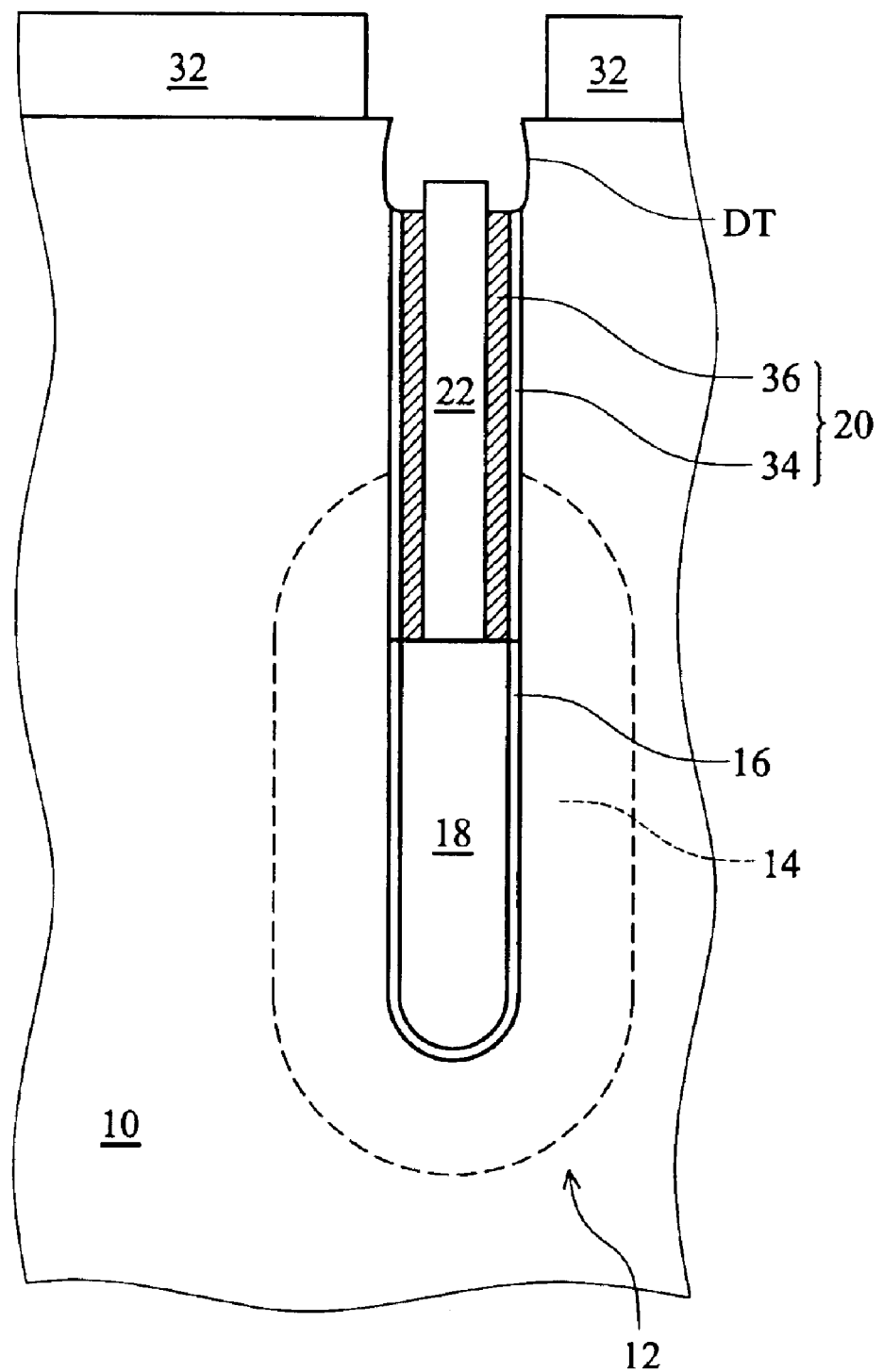
Figure 3A:
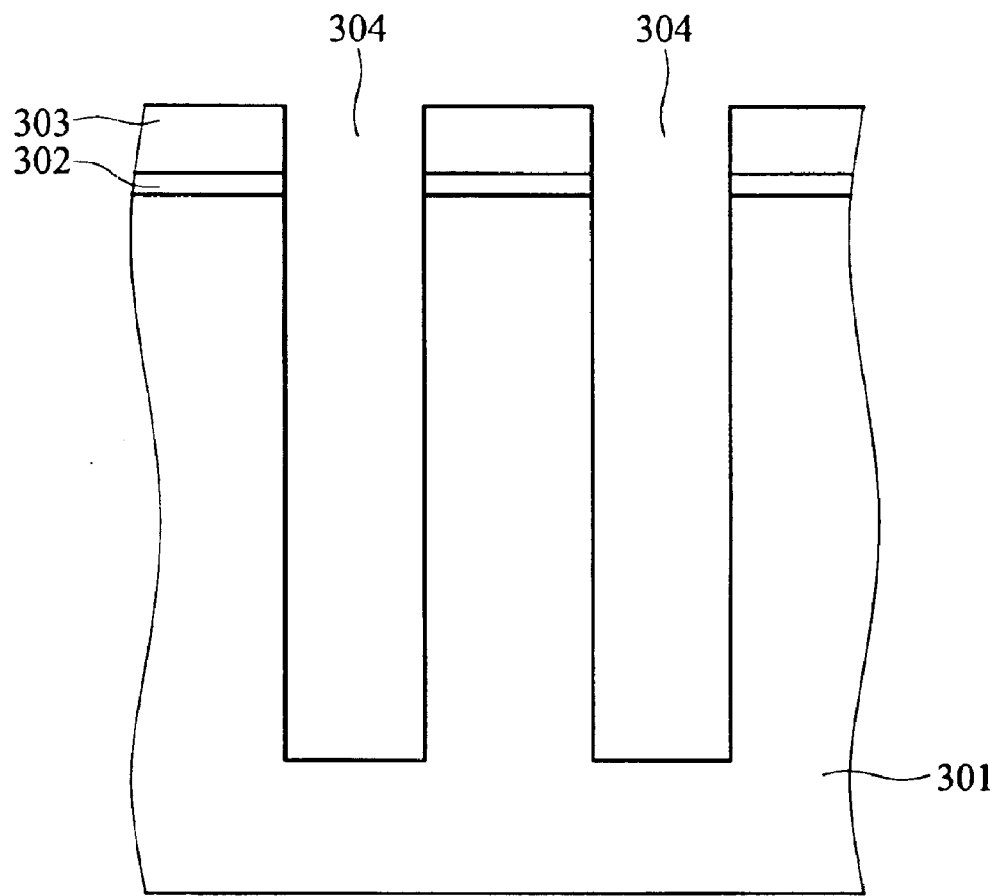
FIGS. 3a to 3h are cross-section showing a method for forming a trench capacitor of the present invention.

In FIG. 3a, a semiconductor substrate 301 is provided. A pad oxide layer 302 and a pad nitride layer 303 are sequentially formed on the semiconductor substrate 301, and a hard mask layer and a patterned photoresist layer with an opening are sequentially formed thereon.

The hard mask layer is etched using the patterned photoresist layer as an etching mask to form an opening, and then the photoresist layer is removed. The pad nitride layer 303 and the pad oxide layer 302 are sequentially etched using the hard mask layer as an etching mask to form a trench 304.

Figure 3B:
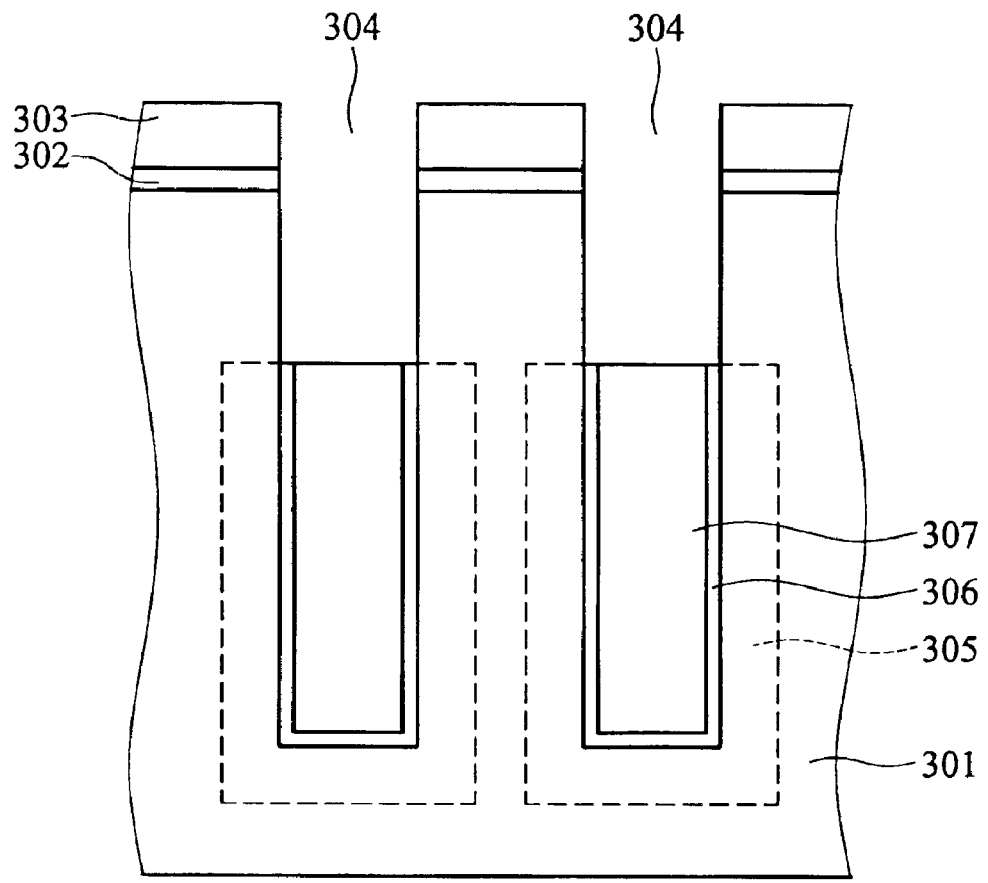

In FIG. 3b, a trench capacitor is formed in a bottom of the deep trench 304. The trench capacitor comprises a buried plate, such as n+ type diffusion region 305, a conformal capacitor dielectric layer 306, and a plate, such as poly layer 307.

In a method for forming the capacitor, a doped oxide layer, such as ASG, is formed on the sidewall and bottom of the deep trench 304, and annealed to diffuse ions into the semiconductor substrate 301 of the deep trench bottom portion to form an n+ type diffusion region 305. The capacitor dielectric layer 306, such as an ON layer or an ONO layer, is formed on the sidewall and the bottom of the deep trench 304. The deep trench 304 is filled with an n+ type doped conducting layer, such as a poly layer 307. The poly layer 307 is recessed to a predetermined depth, acting as a storage node of the capacitor.

Figure 3C:
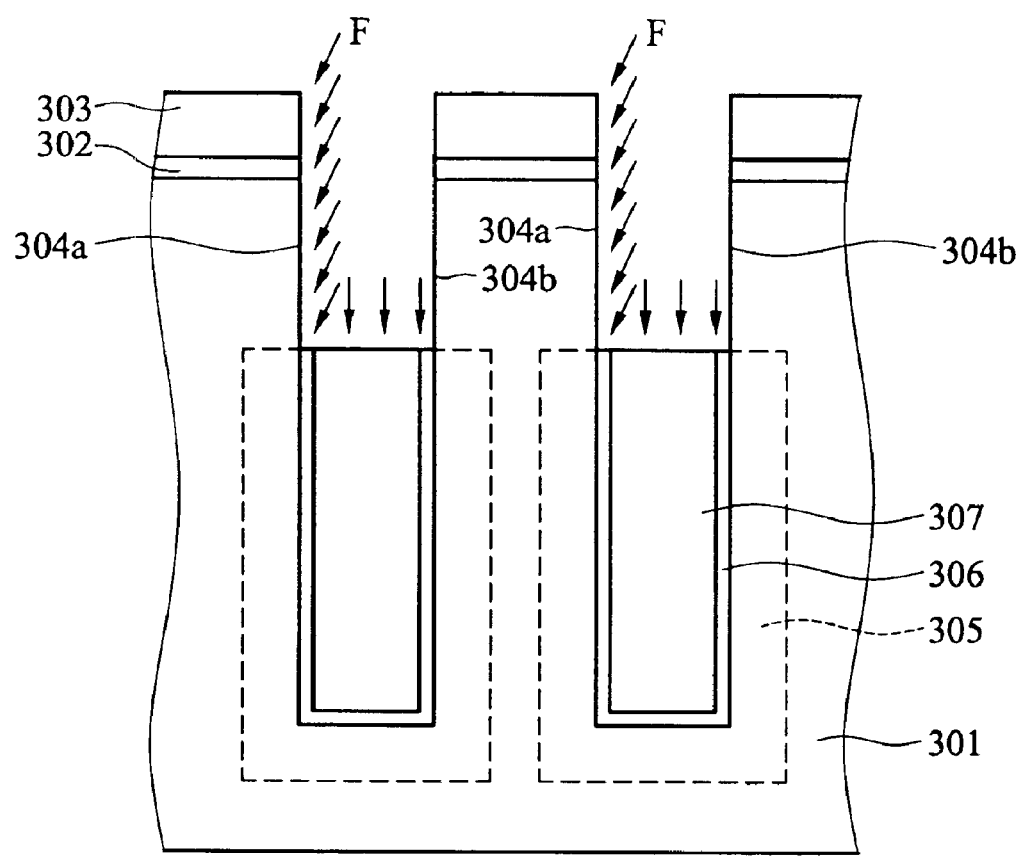

In FIG. 3c, the deep trench 304 is ion implanted at a predetermined angle by a gas mixture containing F, such as fluorine gas, to form an ion doped area on a first sidewall 304 and the surface of the poly layer 307. The predetermined angle is about 10 to 80°.

The semiconductor substrate 301 is oxidized to form an oxide layer on the exposed semiconductor substrate 301 and the exposed poly layer 307 of the deep trench 304. The oxide layer on the ion doped area is thicker than the oxide layer formed on the second sidewall 304b.

Figure 3D:
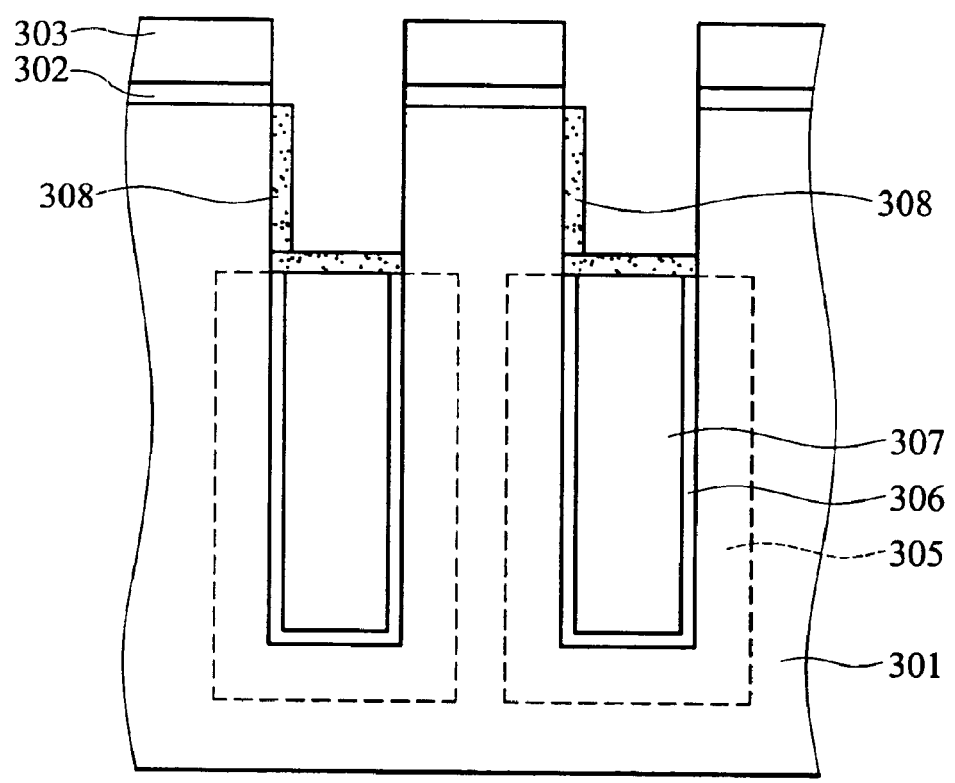

After the oxide layer on the second sidewall 304b is removed, the oxide layer 308 remains on the first sidewall 304 and the poly layer 307 as shown in FIG. 3d.

Figure 3E:
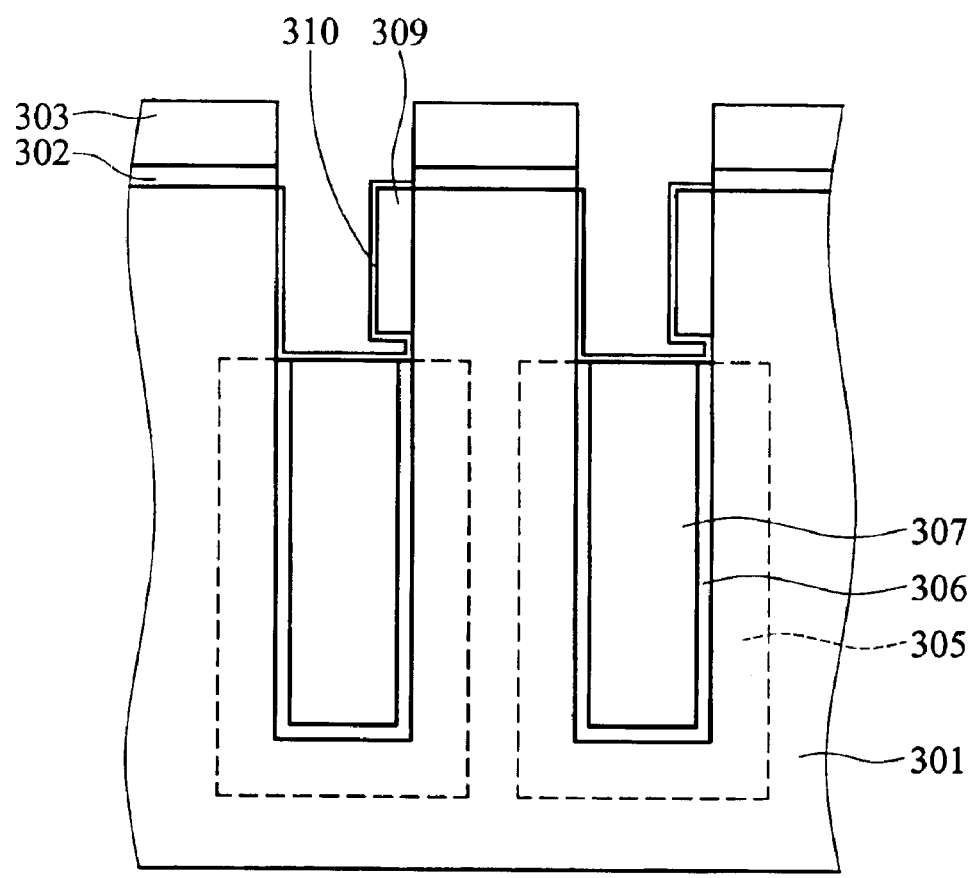

In FIG. 3e, a sidewall layer 309, such as p+ type epi-silicon layer, is formed on the second sidewall 304b of the top portion of the trench using the oxide layer 308 as a mask. The oxide layer 308 is then removed. A barrier layer 310, such as a silicon nitride layer, is conformally formed on the exposed semiconductor substrate 301 of the first sidewall 304a, the poly layer 307, and sidewall layer 309. The material of the sidewall layer 309 is the same as the semiconductor substrate 301.

Figure 3F:
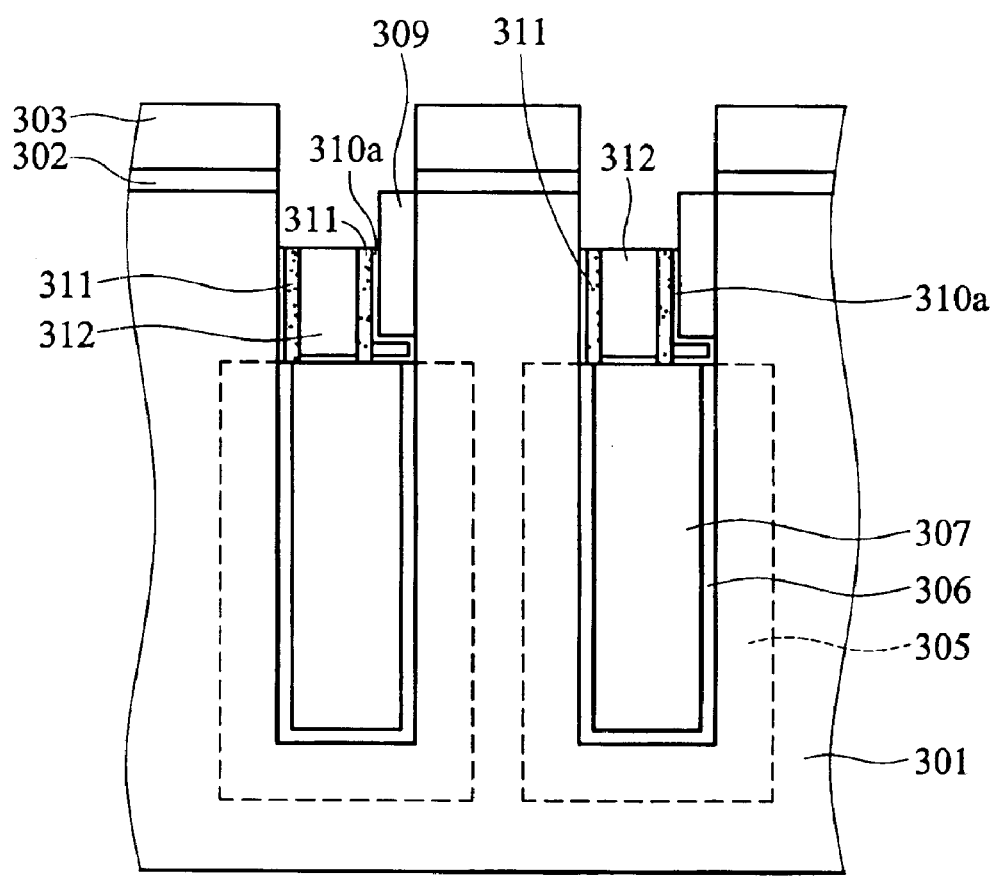

In FIG. 3f, an insulating layer is conformally formed on the semiconductor substrate 301 and the trench 304. The insulating layer is anisotropically etched to form a spacer on the first sidewall 304 and the sidewall layer 309 of the trench 304.

A conducting layer is formed on the semiconductor substrate 301, and the trench 304 is filled with the conducting layer. The conducting layer 312, such as a poly layer, is recessed to a predetermined thickness. The exposed spacer and the exposed barrier layer 310 are removed using the conducting layer 312 as an etching mask to form a spacer 311 and a barrier layer 310a. The spacer 311, such as an oxide layer or a nitride layer, acts as a collar insulating layer to isolate the bottom plate and a conducting wire formed subsequently.

Figure 3G:
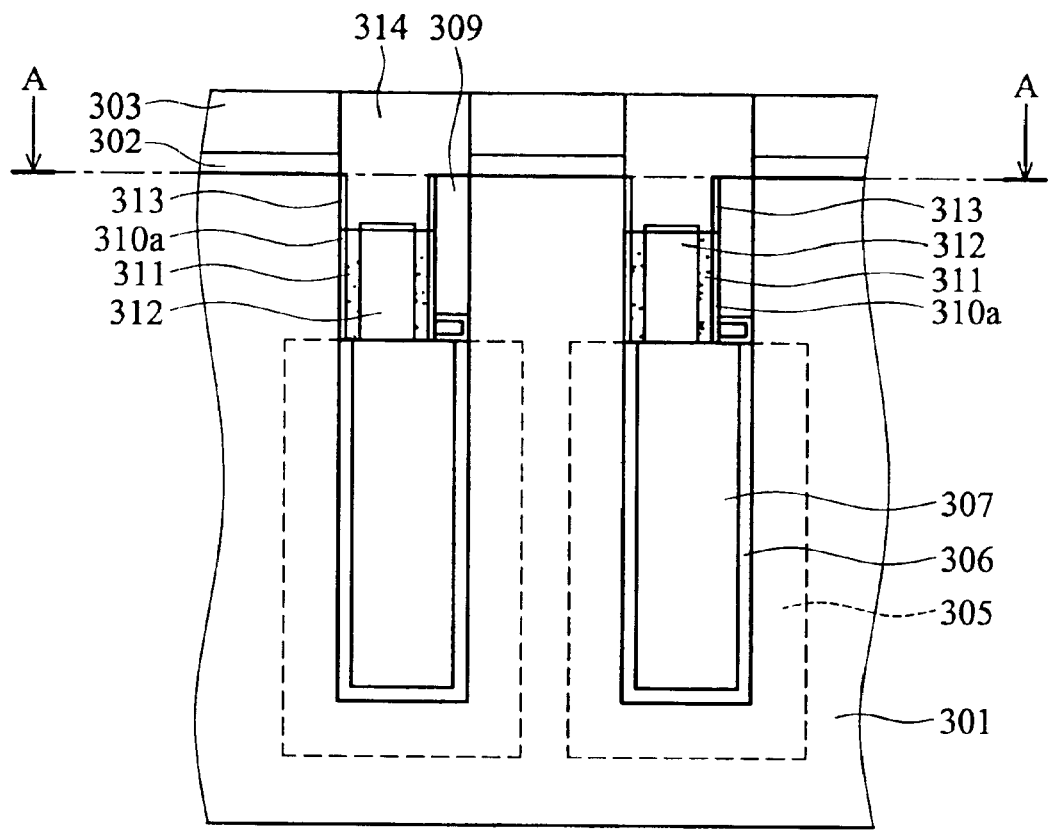

In FIG. 3g, a barrier layer 313 is conformally formed on the exposed semiconductor substrate 301 on the first sidewall 304a, the sidewall layer 309, and the poly layer 307 of the trench 304. A conducting layer is formed on the semiconductor substrate 301, and the trench 304 is filled with the conducting layer. The conducting layer is planarized to expose the pad nitride layer 303 and leave the conducting layer 314, such as a poly layer, in the trench 304. A conducting wire of the capacitor consists of the conducting layer 314 and the conducting layer 312.

Figure 3H:
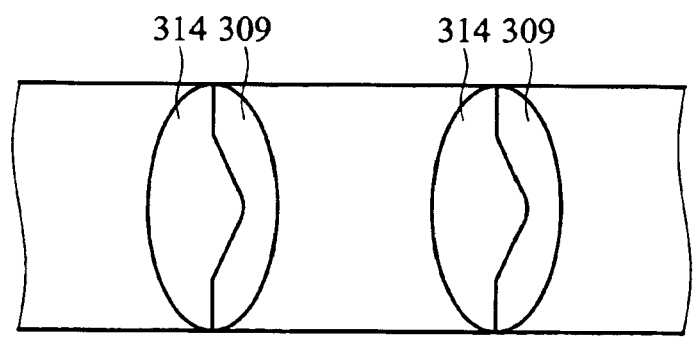

FIG. 3h is an AA line cross-section of FIG. 3g. In FIG. 3h, the sidewall layer 309 is formed beside the conducting layer 314, and the capacitor wires are isolated effectively from each other.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming a trench capacitor, comprising:
   providing a semiconductor substrate, wherein a deep trench and a deep trench capacitor are formed therein, the deep trench capacitor having a node dielectric layer and a storage node, the node dielectric layer covering a sidewall and a bottom portion between the deep trench and the storage node of the deep trench capacitor, and the storage node filling the deep trench to a predetermined depth;

ion implanting the top portion of the deep trench at a predetermined angle to form an ion doped area on a single sidewall of the semiconductor substrate and the top surface of the deep trench capacitor;

forming an oxide layer on the ion doped area;

forming a sidewall layer on the sidewall of the deep trench using the oxide layer as a mask, wherein the sidewall layer is isolated from the storage node of the deep trench capacitor;

removing the oxide layer;

forming a barrier layer on the interior of the deep trench and the sidewall layer; and filling a conducting layer in the deep trench.

2. The method for forming a trench capacitor of claim 1, wherein the ion source of the ion implantation is a gas mixture containing F, which promotes growth of the oxide layer.

3. The method for forming a trench capacitor of claim 2, wherein the gas mixture containing F is fluorine gas.

4. The method for forming a trench capacitor of claim 1, wherein the sidewall layer is an epi-silicon layer.

5. The method for forming a trench capacitor of claim 1, wherein the material of the sidewall layer is the same as the semiconductor substrate.

6. The method for forming a trench capacitor of claim 1, wherein the barrier layer is an oxide layer or a nitride layer.

7. The method for forming a trench capacitor of claim 1, wherein the conducting layer is a poly layer.

8. The method for forming a trench capacitor of claim 1, wherein the node dielectric layer is a silicon nitride layer.

9. The method for forming a trench capacitor of claim 1, wherein the storage node is an n+ type doped poly.

10. A method for forming a trench capacitor, comprising:

providing a semiconductor substrate, wherein a deep trench and a deep trench capacitor are formed therein, the deep trench capacitor having a node dielectric layer and a storage node, the node dielectric layer covering a sidewall and a bottom portion between the deep trench and the storage node of the deep trench capacitor, the storage node filling the deep trench to a predetermined depth, and the deep trench has a first sidewall and a second sidewall;

ion implanting the deep trench top portion at a predetermined angle to form an ion doped area on the semiconductor substrate of the first sidewall and the top surface of the deep trench capacitor;

oxidizing the semiconductor substrate to form a first oxide layer on the ion doped area and a second oxide layer on the second sidewall, wherein the thickness of the first oxide layer exceeds the thickness of the second oxide layer;

removing the second oxide layer to expose the semiconductor substrate of the second sidewall of the deep trench;

forming a sidewall layer on the second sidewall using the first oxide layer as a mask;

removing the first oxide layer to expose the semiconductor substrate of the first sidewall;

conformally forming a first barrier layer on the first sidewall, the sidewall layer, and the deep capacitor;

forming spacers on the first sidewall and a sidewall of the sidewall layer sequentially;

filling a first conducting layer in the deep trench;

etching back the first conducting layer and the spacer to a predetermined depth; and conformally forming a second barrier layer on the first sidewall, the sidewall layer, and the first conducting layer, and the deep trench being filled with a second conducting layer.

11. The method for forming a trench capacitor of claim 10, wherein the ion source of the ion implantation is a gas mixture containing F, which promotes growth of the oxide layer.

12. The method for forming a trench capacitor of claim 11, wherein the gas mixture containing F is fluorine gas.

13. The method for forming a trench capacitor of claim 10, wherein the sidewall layer is an epi-silicon layer.

14. The method for forming a trench capacitor of claim 10, wherein the material of the sidewall layer is the same as the semiconductor substrate.

15. The method for forming a trench capacitor of claim 10, wherein the first barrier layer is a nitride layer.

16. The method for forming a trench capacitor of claim 10, wherein the spacer is an oxide layer or a nitride layer.

17. The method for forming a trench capacitor of claim 10, wherein the first conducting layer is a poly layer.

18. The method for forming a trench capacitor of claim 10, wherein the second barrier layer is a nitride layer.

19. The method for forming a trench capacitor of claim 10, wherein the second conducting layer is a poly layer.

20. The method for forming a trench capacitor of claim 10, wherein the node dielectric layer is a nitride silicon layer.

21. The method for forming a trench capacitor of claim 10, wherein the storage node is n+ type doped poly.

* * * * *